(12) United States Patent
Stecher

(10) Patent No.: US 8,736,070 B2
(45) Date of Patent: May 27, 2014

(54) SEMICONDUCTOR COMPONENT COMPRISING COPPER METALLIZATIONS

(71) Applicant: Infineon Technologies Austria AG, Villach (AT)

(72) Inventor: Matthias Stecher, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/054,749

(22) Filed: Oct. 15, 2013

(65) Prior Publication Data

US 2014/0042631 A1 Feb. 13, 2014

Related U.S. Application Data

(62) Division of application No. 12/239,836, filed on Sep. 29, 2008.

(30) Foreign Application Priority Data

Sep. 28, 2007 (DE) .......................... 10 2007 046 556

(51) Int. Cl.
*H01L 23/48* (2006.01)
*H01L 23/52* (2006.01)
*H01L 29/40* (2006.01)

(52) U.S. Cl.
USPC .................. 257/774; 257/E23.145; 257/781; 257/784; 438/614; 438/617

(58) Field of Classification Search
CPC ................ H01L 23/48; H01L 23/5226; H01L 2924/01078
USPC ............ 257/E23.01, E23.145, 335, 692, 750, 257/762, 765, 781, 784, 786; 438/614, 617, 438/618, 631, 633, 687, 692, 697, 693
See application file for complete search history.

(56) References Cited

U.S. PATENT DOCUMENTS

| | | | | |
|---|---|---|---|---|
| 5,502,337 | A * | 3/1996 | Nozaki | 257/773 |
| 5,751,065 | A * | 5/1998 | Chittipeddi et al. | 257/758 |
| 6,313,537 | B1 * | 11/2001 | Lee et al. | 257/758 |
| 6,489,689 | B2 * | 12/2002 | Nojiri | 257/786 |
| 6,633,087 | B2 * | 10/2003 | Ker et al. | 257/786 |
| 6,825,563 | B1 * | 11/2004 | Ranganathan et al. | 257/758 |
| 6,856,022 | B2 * | 2/2005 | Nojiri et al. | 257/773 |
| 6,908,841 | B2 * | 6/2005 | Burrell et al. | 438/612 |
| 6,909,196 | B2 * | 6/2005 | Batra et al. | 257/781 |
| 7,034,384 | B2 * | 4/2006 | Tsai | 257/678 |
| 7,391,114 | B2 * | 6/2008 | Mimura et al. | 257/758 |
| 7,884,478 | B2 * | 2/2011 | Azuma | 257/758 |
| 8,102,056 | B2 * | 1/2012 | Takemura et al. | 257/774 |

* cited by examiner

*Primary Examiner* — Chris Chu
(74) *Attorney, Agent, or Firm* — SpryIP, LLC

(57) ABSTRACT

A semiconductor component having improved thermomechanical durability has in a semiconductor substrate at least one cell comprising a first main electrode zone, a second main electrode zone and a control electrode zone lying in between. For making contact with the main electrode zone, at least one metallization layer composed of copper or a copper alloy is provided which is connected to at least one bonding electrode which likewise comprises copper or a copper alloy.

14 Claims, 3 Drawing Sheets

SEMICONDUCTOR COMPONENT COMPRISING COPPER METALLIZATIONS

RELATED APPLICATION

The instant application is a divisional application of copending U.S. patent application Ser. No. 12/239,836, which was filed on Sep. 29, 2008. The entire contents of the indicated copending US patent application are incorporated herein by reference. The copending US patent application claimed priority to German Application No. 10 2007 046 556 filed Sep. 28, 2007, which is incorporated by reference herein in its entirety.

FIELD OF THE INVENTION

The invention relates to a semiconductor component comprising at least one cell formed in a semiconductor substrate and comprising at least one metallization layer arranged above the semiconductor substrate and composed of copper or a copper alloy for the electrical connection of the cell.

BACKGROUND

Semiconductor components, in particular for power applications, are often constructed in the form of cells which can be used to form a multiplicity of, in particular, semiconductor structures of identical type in a semiconductor component. This structure is used in particular for switches for controlling high currents, such as, for example, field-effect transistors, bipolar transistors, IGBTs or thyristors.

In this case, an evolution of heat occurs in the semiconductor component on account of the current loading, which evolution of heat thermally loads the various parts of the semiconductor component and can lead to damage to the semiconductor component.

Furthermore, in power semiconductors a low electrical resistance is advantageous in order that the electrical losses in the semiconductor component and thus also the evolution of heat are kept small. This can be achieved by using conductor structures having a high cross section, although conductor structures having a high cross section lead to problems upon thermal loading on account of the thermal expansion.

SUMMARY OF THE INVENTION

A semiconductor component has in a semiconductor substrate at least one cell comprising a first and a second main electrode zone and a control electrode zone lying in between. At least one metallization layer composed of copper or a copper alloy is arranged above the semiconductor substrate, and is connected to at least one bonding electrode and electrically coupled to at least one main electrode zone. The at least one bonding electrode comprises copper or a copper alloy. Copper is used hereinafter as synonymous with copper or copper alloy.

DETAILED DESCRIPTION

Figure 1:
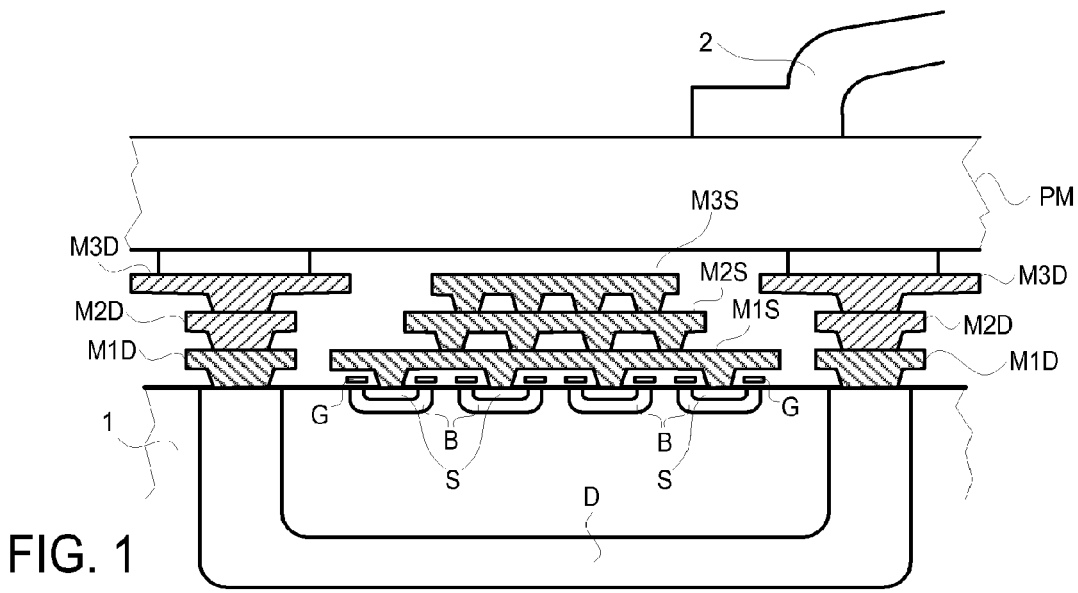
FIG. 1 shows a cross section through a section of a semiconductor component in accordance with a first exemplary embodiment with a plurality of vertical field-effect transistors arranged in elongate cells, transversely with respect to the course of the cells.

The semiconductor component illustrated sectionally in part in FIG. 1 has a semiconductor substrate 1 composed of silicon, in which a total of eight transistors are formed which are elongate and extend perpendicular to the plane of the drawing. The transistors are field-effect transistors and each have a source zone S and a drain zone D, wherein the drain zones D of all the transistors form a single doped region and the source zones S of two adjacent transistors together form a doped region.

Situated between the source zones S and the drain zones D is in each case a channel region B, which is also called a body zone. The source zones S and the drain zones D form the main electrode regions through which the current controlled by the transistors flows. These main electrode regions S, D are connected to main electrode zones or merge into main electrode zones which are connected to further conductors outside the semiconductor substrate 1.

Above the channel regions B, outside the semiconductor substrate 1, gate electrodes G are provided in a manner isolated from the channel regions B by a thin insulating layer. The insulating layer between the channel regions B and the gate electrodes G is a thin silicon oxide layer.

Furthermore, the semiconductor substrate 1 is covered with a silicon oxide layer having openings in the region of the source islands S and of the drain connection region D, plated-through holes of a first metal layer M1 arranged above the semiconductor substrate 1 being arranged in said openings.

The drain zones D together form a drain connection region that runs laterally within the semiconductor substrate 1 and, at the sides of the cell array, extends upwards as far as that side of the semiconductor substrate 1 in which the source islands S are arranged. The main electrode zones for the source islands S and the drain islands D are thus situated on the same side of the semiconductor substrate 1.

The first metallization layer M1 comprises copper or a copper alloy and is produced in accordance with a dual damascene process, such that the plated-through holes at the underside of the first metallization layer M1 are formed integrally with the latter from the same material. A barrier layer (not illustrated) composed of titanium/tungsten-titanium is arranged between the copper material of the first metallization layer M1 and the semiconductor substrate. In addition, in a variant of this embodiment it is also possible to produce the plated-through holes below the first metallization layer M1 from tungsten and then, in a second work step, to form the first metallization layer M1 from copper thereabove in a single damascene process. The first metallization layer M1 is patterned into islands M1D, M1S, three of which are illustrated in FIG. 1. The two outer islands M1D are each connected to the drain main electrode zone D and the middle island M1S is connected to the four source main electrode zones S.

A second metallization layer M2 likewise composed of copper or of a copper alloy is arranged above the first metallization layer M1. The second metallization layer M2 is produced in accordance with the dual damascene process, such that plated-through holes formed integrally at the bottom on the second metallization layer and composed of the same material are formed through to the underlying first metallization layer M1.

The same applies to a further third metallization layer M3 formed above the second metallization layer M2. A power metallization layer PM is arranged above the third metallization layer M3, said power metallization layer being connected to third islands M3D of the third metallization layer M3.

A bonding electrode 2 composed of copper or a copper alloy is fixed at the top on the power metallization layer PM.

The islands of the individual metallization layers M1 to M3 which are in each case arranged one above another and connected to one another contact-connect the two main electrode zones D, S as far as towards the top to the power metallization layer PM.

Figure 2:
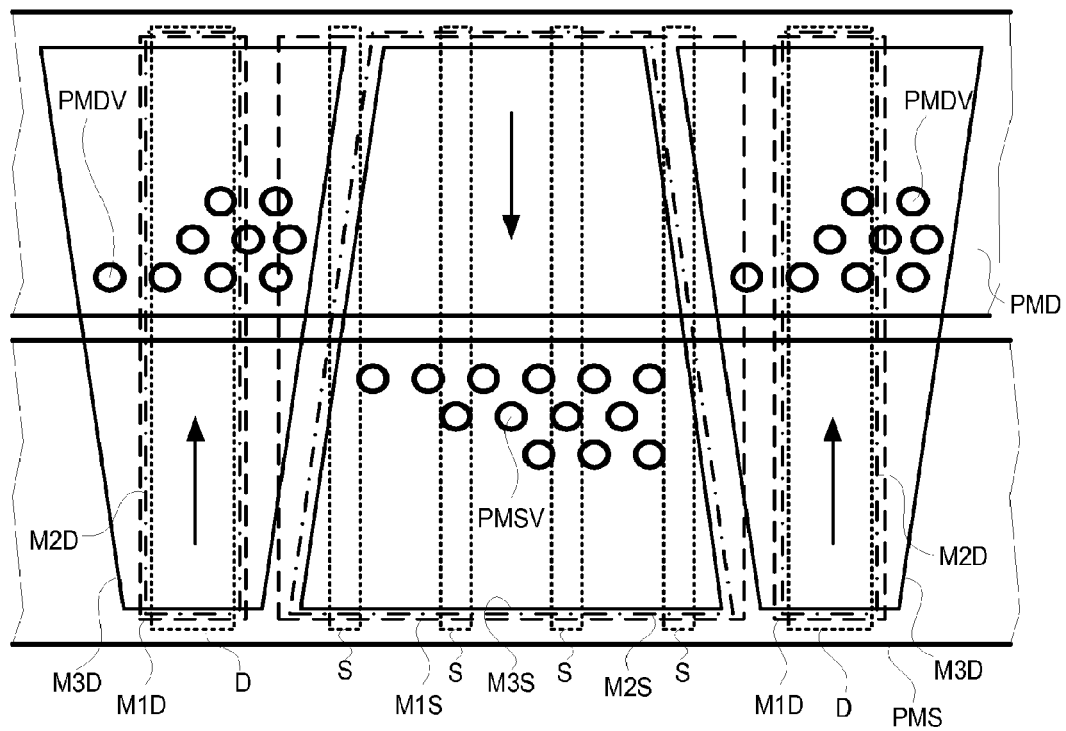
FIG. 2 shows a plan view of the section of the semiconductor component according to FIG. 1.

FIG. 2 illustrates a plan view of that part of the semiconductor component which is illustrated sectionally in FIG. 1. The illustration of the gate electrodes G was dispensed with in this view for the sake of better clarity. The contours of the elongate main electrode zones D, S are illustrated in dotted fashion at the very bottom. In this case it can be discerned that a wide drain main electrode zone D is respectively arranged on the outer side and four narrower elongate source main electrode zones S are arranged in between. All the main electrode zones D, S are arranged parallel to one another and have at least substantially the same length.

First drain islands M1D of the first metallization layer M1 are in each case arranged on the two drain main electrode zones D, said first drain islands having substantially the same elongate, rectangular contour as the underlying drain main electrode zones D and being electrically connected to the latter downwards over the entire length of the main electrode zones D. An electrical connection over the entire length should generally be understood within this description as the provision of contact locations at least substantially over the entire length, wherein a single contact location extending in large-area fashion over the length or else a plurality of contact locations distributed over the length can be provided.

The source main electrode zones S are connected to a first source island M1S of the first metallization layer M1, which is electrically connected to the four source main electrode zones S over the entire length thereof. The first source island M1S of the first metallization layer M1 is accordingly significantly wider than the two first drain islands M1D.

Arranged above the first islands M1D, M1S are second islands M2D, M2S of the second metallization layer M2, which are illustrated by a dash-dotted line and are electrically connected to the respective underlying first island M1D, M1S over the entire length thereof. In this case, second drain islands M2D are arranged above the outer first drain islands M1D, said second drain islands having at least substantially the same contour as the first drain islands M1D. A second source island M2S is arranged above the middle first source island M1S. The second source island M2S has the form of a trapezium or of a rectangle that tapers in the longitudinal direction. The length of the second source island M2S corresponds at least substantially to the length of the first source island M1S. The width of the second source island M2S increases towards the bottom in the drawing. In principle, in the drawings the contours of islands lying one above another are depicted alongside one another for the sake of better clarity, even if the contours can lie one above another, such as in the present case for example the contours of the drain main electrode zones D, of the overlying first drain islands M1D and of the second drain islands M2D arranged thereabove.

The second drain islands M2D have at least substantially the same contour as the underlying first drain islands M1D.

Third islands M3D, M3S are respectively arranged above the second islands M2D, M2S. Two third drain islands M3D are respectively arranged above the two second drain islands M2D. The third drain islands M3D have a trapezium form or the form of a narrowing elongate rectangle which extends in the longitudinal direction of the second drain islands M2D. The width of the third drain islands M3D decreases in the direction in which the width of the second source island M2S increases. The third drain islands M3D are electrically connected to the respective underlying second drain islands M2D over the entire length thereof. Arranged above the second source island M2S is a third source island M3S, which has a trapezium form similar to that of the second source island M2S but is narrower overall. This has the effect that the third drain islands M3D have the same distance horizontally laterally inwards with respect to the third source region M3S as inwards obliquely downwards with respect to the second source island M2S, such that the required dielectric strength is achieved with good utilization of the space for current-carrying interconnects.

Arranged above the third islands M3D, M3S are two power islands PMD, PMS running transversely, which are patterned from the power metal layer PM. The drain power island PMD for making contact with the third drain islands M3D runs at the top in the drawing. For this purpose, the drain power island PMD has at its underside plated-through holes PMDV, which are illustrated by means of solid circles, in the sections lying directly above a third drain island M3D. Only a few of the plated-through holes PMDV of the drain power island PMD are illustrated in a representative manner. The plated-through holes PMDV of the drain power island PMD are situated only in the upper section of the third drain island M3D in the drawing, such that the current taken up by the lower section of the third drain island M3D in the drawing from the underlying metallization layer first has to flow in a lateral direction in order to be able to flow via the plated-through holes PMDV into the drain power island PMD. This current flow is illustrated in both drain islands M3D by an upwardly directed arrow with a solid line.

The source power island PMS for making contact with the third source island M3S runs transversely at the bottom in the drawing. In this case, too, the third source island M3S is connected to the overlying source power island PMS only in the section in which the third source island M3S lies directly below the source power island PMS. These connections are produced by plated-through holes PMSV illustrated by means of solid circles in the drawing, only some of which are illustrated in a representative manner for the sake of better clarity. Since, in this case, the upper section of the third source island M3S in the drawing is not directly connected to the source power island PMS, the current taken up in this section from the underlying metallization layer M2 first has to be forwarded towards the bottom in the drawing in order to be able to flow away into the source power island PMS in the lower section of the third source island M3S in the drawing. This current flow is illustrated by a downwardly directed arrow with a solid line. The lateral current flows illustrated by arrows can be distributed among the three metallization layers M1, M2, M3 in accordance with the electrical resistances afforded and need not necessarily take place solely in the islands M3D, M3S of the third metallization layer M3.

The two power islands PMD, PMS, finally, are connected to bonding electrodes 2 (not illustrated in FIG. 2).

An increased mechanical strength in conjunction with a low electrical resistance and hence low electrical losses is obtained by using copper both for the topmost metallization layer and for the bonding electrode connected to said metallization layer. This construction leads to an increased endurance with respect to thermal loading such as, for example, in the case of rapid heating. At the same time, the electrical losses are reduced on account of the increased conductivity of copper. Overall, therefore, it is possible to provide a component which achieves a higher reliability even in the case of higher thermal loading. The thermal loading may be caused by momentary electrical losses, for example, if the semiconductor component is for example part of a circuit arrangement in which it is connected in series with an inductive load and in which no freewheeling diode is provided.

The topmost metallization layer connected to the at least one bonding electrode is advantageously thicker than 1 μm. If the semiconductor component has a plurality of metallization layers, then the topmost metallization layer connected to the bonding electrode is preferably by far the thickest metallization layer.

It is also possible to provide a single metallization layer composed of copper, which has a barrier layer on the side facing the semiconductor substrate. The barrier layer can be formed for example from a combination of a titanium layer with 30 nm, for example, and a tungsten-titanium layer with 300 nm, for example. The barrier layer is provided at least in the regions in which no further layer is arranged between the copper and the semiconductor material. The overlying copper layer can have for example a thickness of plural μm and for example greater than 10 μm.

An auxiliary layer can be arranged below the at least one bonding electrode, said auxiliary layer being harder than the at least one metallization layer composed of copper or a copper alloy. This auxiliary layer can increase the mechanical stability and contribute to taking up the forces that act during bonding, and in this way to protecting underlying structures. By way of example, NiP, NiMoP, NiV, CoWP, CoW or W is appropriate as material for the auxiliary layer. In general, the auxiliary layer can be composed of nickel, cobalt, tungsten or an alloy of these metals.

The main electrode zones should be understood to mean the regions through which the current controlled by the semiconductor component flows and which serve for making contact with further conductor structures outside the semiconductor substrate, wherein the main electrode zones are not necessarily limited to the doped semiconductor regions which directly form the transistor or generally the current switching element. Rather, the main electrode zone can also comprise conductive zones for example in the form of doped regions within the semiconductor substrate in order to carry the current as far as a metallization layer. Thus, in the case of a vertical field effect transistor, for example, the drain zone can be situated within the semiconductor substrate and be connected to a connection region at the surface of the semiconductor substrate by means of a drain contact-making zone. By way of example, a buried n-doped layer can be produced, which carries the current below the transistors in a lateral direction and which extends via perpendicularly running n-doped zones as far as the surface of the semiconductor substrate in order to be able to be connected to a metallization layer there. In the case of a lateral transistor, in which drain and source are situated at the surface of the semiconductor substrate, the two main electrode zones can be formed directly by the source region and by the drain region.

In one embodiment, a first metallization layer patterned into first islands is arranged above the semiconductor substrate. The first islands are formed in such a way that a respective assigned first island of the first metallization layer is arranged above a respective main electrode zone and is connected thereto. In this case, the first islands assigned to a main electrode zone have the at least substantially same contour as the respectively assigned main electrode zone. In the case of elongate main electrode zones, this can be configured in such a way that the edges of the longitudinal sides of the main electrode zone run parallel to the edges of the longitudinal sides of the assigned first island. In this case, the first island can be narrower or wider than the assigned main electrode zone and also longer or shorter than the latter. What is essential in this case is that the width of the first island follows over its length the width of the underlying main electrode zone at this location.

A second metallization layer can be arranged above first islands which are configured in this way and the width of which follows the width of the respective underlying main electrode, said second metallization layer being patterned into second islands in such a way that at least one overlying second island of the second metallization layer is arranged for each first island of the first metallization layer. The first islands are electrically connected to the respectively assigned second islands. Preferably, each first island is assigned a second island. In this case, the contours of the second islands can be different from the contours of the respectively assigned first islands. In the case of elongate first and second islands, this can be embodied in such a way that the edges of the longitudinal sides of the second islands form an angle with the edges of the longitudinal sides of the first islands or do not run parallel to one another. In this way, the width of the second islands over the length thereof can increase or decrease in comparison with the width of the first islands over the length thereof. This can be used, in the case of a non-uniform current flow along the longitudinal extent of elongate second islands, to adapt the cross section of the second islands to the respective current flow since the metallization layers quite generally have a substantially uniform thickness over the area and changes in the cross section of the islands generally have to be achieved by changing the width of said islands.

Such non-uniformities of the current flow over the length of elongate islands may arise in particular when a current connection on the underside of an island is situated at a different location from a current connection on the top side of said island. By way of example, the island can have connection regions on the underside and on the top side, wherein the connection regions on the underside are offset with respect to the connection regions on the top side. In this case, the current fed into a specific connection region on the underside can flow to a further connection region on the underside and, together with the current fed in at this location, flow further to a connection region at the top side that is arranged offset with respect to both the aforementioned lower connection regions. In this case, only the current fed into the first connection region flows between the two lower connection regions and the sum of the currents fed in at the two lower connection regions flows between the second lower connection region and the upper connection region, such that here preferably the region of the island between the second lower connection region and the upper connection region is made wider in order to minimize differences in the current density within the island.

In a semiconductor component, a metallization layer can be patterned into elongate islands which are arranged parallel to one another and are respectively assigned to one of a plurality of connection groups, wherein there is situated between the islands of one connection group at least one island of another connection group, such that the islands of a connection group do not all lie directly alongside one another.

In order to make contact with the islands of a connection group jointly, an overlying metallization layer can be patterned into elongate collective islands which extend transversely over the elongate islands of the underlying metallization layer and can be assigned to the respective connection groups, such that a collective island runs across at least two and in particular all underlying islands of the respective connection group and can be connected to them. By way of example, the connection groups can be source and respectively drain contacts of a multiplicity of transistors which are intended to be connected in parallel in each case via two collective islands. The two collective islands can run at an angle and in particular perpendicular to the elongate islands of the underlying metallization layer and be connected to them in order to combine the currents of the drain islands and respectively of the source islands of the underlying metallization layer in a collective island.

If a section of an island is situated below a collective island that is not assigned to this island, and this section has at least one electrical contact at its underside, the current in this section must first be passed laterally as far as a location at which this island is connected to an assigned collective island at the top side. This is provided for example in the cases in which the islands of the metallization layer below the metallization layer of the collective islands, on the underside, have electrical contacts in a manner distributed over substantially the entire area. In this case, the current intensity increases in a section below a non-assigned collective island in the direction in which is situated the contact to the collective island that is assigned to the island of this section. The increase in the current intensity can be at least partly compensated for by widening of this section in the direction of increasing current intensity.

The metallization layers composed of copper can be produced by means of a damascene process. A single damascene or dual damascene process can be used in this case, wherein the plated-through holes arranged below the metallization layer can be concomitantly produced in one work step by means of the dual damascene process. In the latter case, the plated-through holes are embodied integrally with the overlying metallization layer and necessarily from the same material. The plated-through holes below a metallization layer produced by means of the single damascene process can be produced from copper or else from some other material such as tungsten, for example.

In one embodiment, the semiconductor component is a combination of a power component and an analogue and/or digital low power component. The low power component can be for example analogue signal processing and/or digital logic. The power component can be for example a bipolar transistor, a field-effect transistor, an IGBT or else a thyristor.

The at least one bonding electrode composed of copper and connected to the topmost metallization layer can be a copper wire fixed for example by wetch bonding or by means of copper nailheads. Moreover, the bonding electrode can also be a strip-type copper conductor that is welded onto the topmost metallization layer.

In a further embodiment, elongate islands below islands of a power metallization can have two conical sections one behind another according to the length, wherein the width of the two conical sections increases in the direction of the respective other conical section. This can result substantially in the contour of a rhombus for these islands. In a special case, the elongate islands can have a conical section and a straight section, wherein the conical section faces the straight section by its wider end. The widest location of an island shaped in this way can be arranged in this case in the region in which a connecting location to an island running transversely thereabove is provided.

Figure 3:
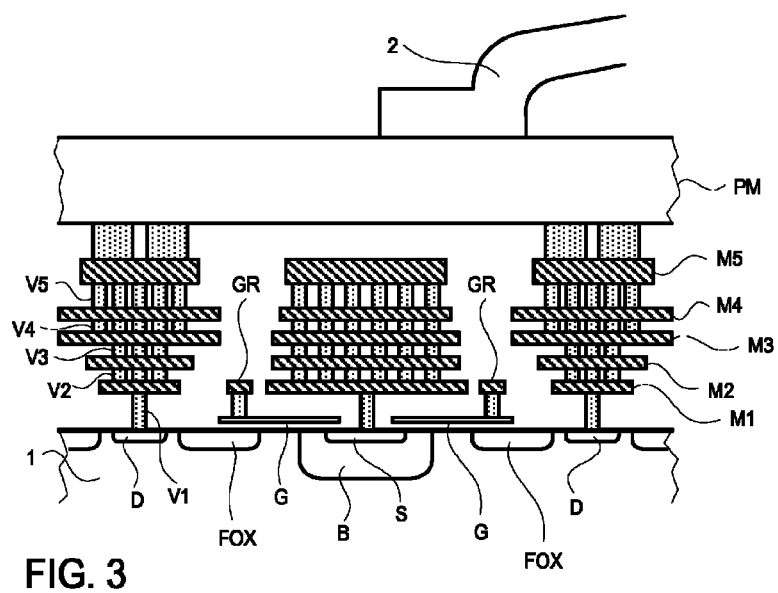
FIG. 3 shows a cross section through part of a semiconductor component in accordance with a second exemplary embodiment with lateral field-effect transistors.

FIG. 3 illustrates a further exemplary embodiment of a semiconductor component wherein the cells, however, have lateral transistors comprising a drain zone, a source zone and a channel zone B lying in between, which are all situated on the same side of the semiconductor substrate 1. The excerpt illustrated in FIG. 3 shows two transistors, the source zones of which merge into one another and are formed by a single source zone S in the centre and which have two outer drain zones D. The two outer drain zones illustrated simultaneously form the drain zones for further transistors which are adjacent on the left and right and are not fully illustrated. Situated between the source zone S and the left-hand and respectively right-hand drain zone D is a channel zone B, which encloses the source zone S within the semiconductor substrate 1 and reaches as far as the surface of the semiconductor substrate 1. Electrodes G are situated above the sections of the channel zone B which reach right into the surface of the semiconductor substrate 1, said electrodes being insulated from the semiconductor substrate 1 by means of a thin silicon oxide layer. The current flows in each transistor between the respective source zone and the respective drain zone and is controlled by the voltages present at the respective gate electrode G relative to the potential in the source zone. The source zone S and the two drain zones D are elongate and extend perpendicular to the plane of the drawing. The same applies to the gate electrodes G. Between the channel zone B and the two drain zones D, two field oxide regions FOX are arranged at the surface of the semiconductor substrate 1, and ensure that no conductive connection to the semiconductor substrate 1 is produced in the case of a gate plated-through hole that is inadvertently etched too deep.

The gate electrodes G extend from the region above the channel zones also somewhat further in the direction of the drain zones D.

The drain zones D, the source zones S and also the two gate electrodes G are contact-connected upwards by means of vias or plated-through holes composed of tungsten. Plated-through holes or vias are illustrated in principle in a dotted manner in FIG. 3. A first metallization layer M1 composed of copper is arranged at the top on the first plated-through holes V1, the first metallization layer being electrically connected to the respective underlying plated-through holes V1 and being patterned into corresponding islands, wherein the islands of the first metallization layer M1 which are connected to drain zones D are called first drain islands and the islands correspondingly connected to the source zone are called first source islands. The islands of the first metallization layer M1 which are connected to the two gate electrodes are referred to as gate runners GR. Above the first metallization layer M1, islands of a second metallization layer M2 are connected to the corresponding underlying islands of the first metallization layer M1 by means of second vias V2. The same applies to a third metallization layer M3 arranged thereabove, a further fourth metallization layer M4, and also a fifth metallization layer M5, which are connected to the respective underlying metallization layer by means of third vias V3, fourth vias V4 and fifth vias V5, respectively. The vias V2, V3, V4 and V5 below further metallization layers M2, M3, M4 and M5 can comprise tungsten or else copper. For reasons of clarity, of the numerous vias V1, V2, V3, V4 and V5 only the vias respectively illustrated on the left in the drawing are identified by a reference numeral. The further vias illustrated in each case to the right thereof at the same level should be assigned to said reference numeral.

If the interconnects of the metallization layers M2 to M5 are produced in a single damascene process, then they are not connected integrally to the respective underlying plated-through holes V2 to V5, such that the material of said plated-through holes V2 to V5 can be chosen independently of the material of the metallization layers M2 to M5 and can be copper or tungsten, for example.

If the metallization layers M2 to M5 are produced in a dual damascene process, then they are formed integrally with the respective underlying plated-through holes V2 to V5, such that said plated-through holes V2 to V5 comprise the same material as the respective overlying metallization layer M2 to M5.

The metallization layers M1 to M4 all have substantially the same thickness, whereas the fifth metallization layer M5 is somewhat thicker.

The islands into which the first five metallization layers M1 to M5 are patterned are elongate and run substantially parallel to one another. The drain zones D and also the source zone S are contact-connected through towards the top via stacks of islands of the different metallization layers M1 to M5, which islands are connected to one another and lie one above another. The islands of the fifth metallization layer M5 in turn are connected to transversely running power islands of a power metallization layer PM. The task of these power islands PM is to connect the different drain islands and respectively the different source islands of the semiconductor component to one another. For this purpose, they run substantially transversely with respect to the elongate islands of the first five metallization layers M1 to M5.

The power island PM illustrated in FIG. 3 is a power island for making contact with the drain zones D and therefore only has plated-through holes to the islands of the fifth metallization layer M5 which are connected to the drain zones D.

The semiconductor component in accordance with FIG. 3 has at least one further power island PM (not illustrated) for making contact with the source zone S which has plated-through holes to the centrally illustrated island of the fifth metallization layer M5.

The distances between all the islands of all the metallization layers M1 to M5, PM which are connected to the source zone S and all the islands of all the metallization layers M1 to M5, PM which are connected to the drain zones D are large enough to achieve the dielectric strength required by the semiconductor component.

With regard to the distances necessary for the required dielectric strength, all of the conductors GR connected to the gate electrodes G should be treated like conductors or islands connected to the source region S.

The contours of the islands of the different metallization layers can be substantially rectangular, trapezium-shaped or rhomboidal. Preferably, the islands of the bottommost metallization layer have the same contours as the respective underlying main electrode zones and the islands of metallization layers arranged further up have trapezium-shaped contours at least in sections. Such trapezium-shaped sections are appropriate for carrying the current laterally if, from an underlying metallization layer, the current flows into this section with a surface density that is substantially constant over the area, and flows from this section into an overlying layer with a surface density that is non-uniform over the area, such that the laterally flowing current is not constant in a lateral direction. The cross section of the current intensity can be at least substantially adapted by means of a width that varies in a lateral direction in this section.

Figure 4:
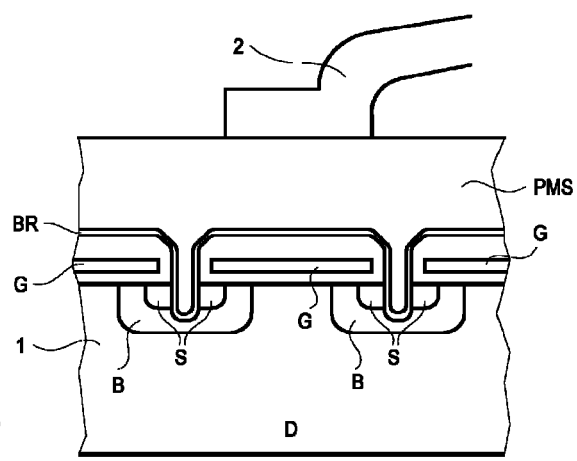
FIG. 4 shows a cross section through part of a semiconductor component in accordance with a third exemplary embodiment with a single metallization layer.

FIG. 4 shows a further exemplary embodiment of a semiconductor component comprising a semiconductor substrate, wherein only a single metallization layer PMS is provided. The semiconductor component illustrated has vertical transistors in which source zones S and channel zones B are formed on that side of the semiconductor substrate 1 which faces the metallization layer PMS. The channel zones B surround the source zones and reach as far as the surface of the semiconductor substrate 1. Gate electrodes G are arranged above those sections of the channel zones B which reach as far as the surface of the semiconductor substrate 1, said gate electrodes being insulated from the semiconductor substrate 1 by a silicon oxide layer surrounding the gate electrodes G.

The semiconductor substrate 1 is completely covered by a barrier layer BR, which reaches through openings in the silicon oxide layer through the source zones right into the channel zones and makes contact with the source zones and the channel regions. The barrier layer BR comprises a lower layer of titanium, which can be 30 nm thick, for example, and an overlying tungsten-titanium layer which can be 300 nm thick, for example. The semiconductor substrate 1 can also be covered directly with a tungsten-titanium layer. The composition of a tungsten-titanium layer can comprise 70% tungsten and 30% titanium. NiV, Ni, NiMo, NiP or NiMoP is appropriate as overlying layer of the barrier layer BR.

A thick power metallization layer PMS composed of copper or a copper alloy, which can be for example at least 20 μm thick, is arranged on the barrier layer BR. At the top the power metallization layer PMS is connected to at least one bonding electrode 2 that likewise comprises copper or a copper alloy.

In general, barrier layers can be provided between the different metallization levels in order to counteract electromigration. This is advantageous particularly at locations having a relatively high current density.

Figure 5:
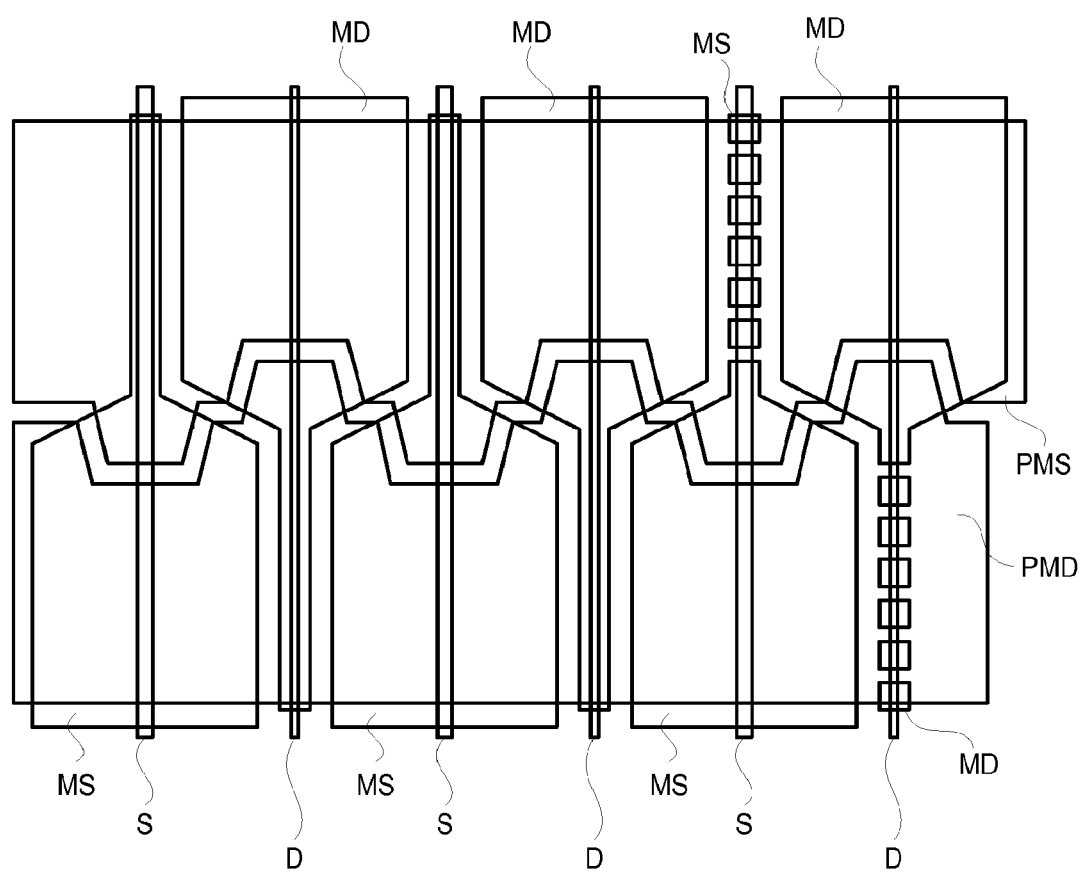
FIG. 5 shows a plan view of a section of a semiconductor component in accordance with a fourth exemplary embodiment.

FIG. 5 shows a further semiconductor component with a plurality of cells in plan view, wherein only part of the cell array is illustrated. The cells are elongate and constructed from lateral MOS transistors, such that the main electrodes and main electrode zones—connected thereto—of the transistors are situated alongside one another on the same surface of the semiconductor substrate. In an alternative to this it is possible to use vertical transistors in which one main electrode is arranged at a top side of the substrate and the main electrode arranged within the substrate is led via a buried conductor as far as the top side and is connected to the main electrode zone there, such that in this case, too, both main electrode zones are situated on the same surface of the substrate.

The two main electrode zones are formed by drain zones D and source zones S which are arranged alternately alongside one another and parallel to one another. In this case, the source zones S can have for example a width of approximately 600 nm and the drain zones can have for example a width of approximately 300 nm. In general, the source zones S can be approximately twice as wide as the drain zones D. Lower islands MS, MD are arranged above the two main electrode zones D, S, which lower islands are parts of a metallization layer and were patterned from the latter. In this case, each drain zone D and each source zone S is connected to a lower island MD, MS in large-area fashion. Hereinafter the lower islands MD connected to the drain zones D are also called lower drain islands MD and the lower islands MS connected to the source zones S are also called lower source islands MS. The lower islands MD, MS are also likewise elongate and run parallel to the underlying drain zones D and source zones S, respectively.

Arranged above the lower islands MD, MS are two collective islands PMD, PMS, which are patterned from a metallization layer which comprises copper or a copper alloy and is significantly thicker in comparison with other metallization layers of the semiconductor component. By way of example, the collective islands PMD, PMS can be 1 μm thick. The collective islands PMD, PMS thus have a significantly lower resistance than the sections of other metallization layers.

The collective islands PMD, PMS run transversely with respect to the lower islands MD, MS and are respectively connected to the lower drain islands MD and the lower source islands MS. The collective island PMD connected to the lower drain islands MD is also called drain collective island PMD hereinafter and the collective island PMS connected to the lower source islands MS is also called source collective island PMS hereinafter. The collective islands PMD, PMS are in strip form and extend in this way over the entire cell array, such that all the lower islands MD, MS can be connected to the corresponding collective island PMD, PMS, wherein the lower islands MD, MS are areally connected to the corresponding collective island PMD, PMS only in the sections in which the lower island MD, MS and the corresponding collective island PMD, PMS overlap.

The collective islands PMD, PMS are connected to the lower islands MD, MS by means of vias, wherein even further other metallization layers can be arranged between the metallization layer of the collective islands PMD, PMS and the metallization layer of the lower islands MD, MS. Likewise, even further other metallization layers can be arranged between the main electrode zones D, S and the lower islands MD, MS.

On account of this structure, the current flow between the main electrode zones D, S and the lower islands MD, MS runs substantially vertically over the entire area of the main electrode zones D, S. Between the lower islands MD, MS and the corresponding collective island PMD, PMS, a substantially vertical current flow takes place only in the overlapping regions, also called overlap sections hereinafter. In the areal non-overlap sections of the lower islands MD, MS which are not covered by the corresponding collective island PMD, PMS connected to the respective lower island MD, MS, a lateral current flow to the overlap sections of the lower islands MD, MS takes place.

The overlap sections of the lower drain islands MD are arranged below the drain collective island PMD and illustrated at the bottom in the drawing. The non-overlap sections of the lower drain islands MD are arranged below the source collective island PMS and illustrated at the top in the drawing. The overlap sections of the lower source islands MS are arranged below the source collective island PMS and illustrated at the top in the drawing. The non-overlap sections of the lower source islands MS are arranged below the drain collective island PMD and illustrated at the bottom in the drawing. The collective islands PMD, PMS have substantially the same width, such that the overlap sections and the non-overlap sections of the lower islands MD, MS have substantially the same length.

Since substantially only a vertical current flow takes place in the overlap sections of the lower islands MD, MS, the overlap sections can be made narrow. By way of example, the overlap sections of the lower islands MD, MS can have substantially the same width as the underlying main electrode zone D, S. It is also conceivable to make the overlap sections at most twice or three times as wide as the underlying main electrode zone D, S or as one of the two main electrode zones D, S. The width of the overlap sections can also be identical for all the lower islands MD, MS.

Since a lateral current flow takes place in the non-overlap sections, the non-overlap sections can advantageously be made significantly wider than the overlap sections. By way of example, the non-overlap sections can be at least five, eight or else ten times as wide as the respective underlying main electrode zone D, S or one of the two main electrode zones D, S. In the latter case, the width of the non-overlap sections would be independent of to which main electrode zone D, S the respective lower island MD, MS is connected, and the non-overlap sections of all the lower islands MD, MS would have the same width.

Each collective island PMD, PMS has at its longitudinal side bulges which are in each case arranged above the corresponding lower islands MD, MS which are connected to the respective collective island PMD, PMS, and which extend in the direction of the non-overlap sections of the corresponding lower islands MD, MS. This leads to a larger overlap area between the lower islands MD, MS and the corresponding collective islands PMD, PMS in the region in which the non-overlap sections merge into the overlap sections and in which the lateral current can be conducted from the non-overlap section upwards into the corresponding collective island PMD, PMS. This can reduce the current density and hence the risk of electromigration.

Indentations can be provided at the locations of the respective other collective island PMD, PMS which lie opposite the bulges. A minimum distance between the collective islands PMD, PMS can thus be ensured.

In a variant which is depicted for the two lower islands MD, MS illustrated on the right in the drawing, the overlap sections have interruptions. Instead of the interruptions it is also possible to provide indentations in which the width of the overlap sections decreases even further. A silicon oxide layer or generally some other hard insulating layer can be provided in the regions of the interruptions or indentations. If the lower islands MD, MS are composed of copper or a copper alloy and are produced in a damascene process, this has the advantage that it is possible to reduce the metal area and thus the dishing during a CMP operation in the vicinity of the interruptions or indentations, such as, for example, also in the non-overlap sections of adjacent lower islands MD, MS that are arranged alongside. In these adjacent non-overlap sections it is then possible to obviate silicon oxide structures for reducing the dishing, which structures would otherwise possibly be necessary, and to reduce the electrical resistance of the non-overlap sections.

Since substantially no lateral current flow takes place in the overlap sections, the interruptions or indentations have no or only a small disadvantageous influence with regard to the electrical resistance of the component. What is important, however, is that the regions of the overlap sections which adjoin the non-overlap sections and via which the current is forwarded from the non-overlap sections to the overlying collective island PMD, PMS have a good electrical connection both to the adjoining non-overlap section and to the corresponding collective island PMD, PMS.

The essential feature of the structure in accordance with FIG. 5 is the different widths of the overlap sections and non-overlap sections and can also be combined with features of the other exemplary embodiments. Furthermore, for the advantage of the different width of the overlap sections and non-overlap sections, all that is significant is that the collective islands PMD, PMS are composed of copper or a copper alloy since these materials have a significantly improved conductivity in comparison with the materials that are otherwise customary for the metallization layers. The collective islands PMD, PMS can then also be connected to bonding electrodes which comprise any desired material and do not necessarily also comprise copper or a copper alloy. By way of example, bonding electrodes composed of gold or aluminium can also be used in the case of the component in accordance with FIG. 5.

The invention claimed is:

1. A semiconductor component comprising:
a semiconductor substrate;
at least one cell formed on the semiconductor substrate and comprising
a plurality of elongate first main electrode zones each respectively connected to one of a plurality of overlying first lower islands via at least one through hole,
a plurality of elongate second main electrode zones arranged alternately with and parallel to the plurality of elongate first main electrode zones and each respectively connected to one of a plurality of overlying second lower islands via at least another through hole, and
a control electrode zone arranged between the first and second main electrode zones;
a first collective island arranged transversely above the pluralities of overlying first and second lower islands and connected to the plurality of overlying first lower islands;
a second collective island arranged transversely above the pluralities of overlying first and second lower islands and connected to the plurality of overlying second lower islands;
wherein the pluralities of overlying first and second lower islands and the first and second collective islands comprise sections of metallization layers,
wherein longitudinal sections of the overlying first and second lower islands covered by and connected to the first and second collective islands are not more than about four times as wide as the pluralities of elongate first and second main electrode zones respectively connected to the pluralities of overlying first and second lower islands,
and wherein longitudinal sections of the overlying first and second lower islands covered by and not connected to the first and second collective islands are at least about five times as wide as the pluralities of elongate first and second main electrode zones respectively connected to the pluralities of overlying first and second lower islands.

2. The semiconductor component according to claim 1, wherein longitudinal sections of the overlying first and second lower islands covered by and not connected to the first and second collective islands are at least about eight times as wide as the pluralities of elongate first and second main electrode zones respectively connected to the pluralities of overlying first and second lower islands.

3. The semiconductor component according to claim 1, wherein longitudinal sections of the overlying first and second lower islands covered by and connected to the first and second collective islands are not more than about twice as wide as the pluralities of elongate first and second main electrode zones respectively connected to the pluralities of overlying first and second lower islands.

4. The semiconductor component according to claim 1, wherein longitudinal sections of the overlying first and second lower islands covered by and connected to the first and second collective islands comprise interruptions in a longitudinal direction, and wherein a dielectric is arranged between the interruptions.

5. The semiconductor component according to claim 4, wherein the dielectric comprises silicon oxide.

6. A semiconductor component comprising:
semiconductor substrate; and
at least one cell formed in the substrate and comprising
a first main electrode zone,
a second main electrode zone,
a control electrode zone disposed between the first and second main electrode zones,
a first metallization layer comprising at least one of copper or a copper alloy and connected to at least one of the first and second main electrode zones and to at least one bonding electrode comprising at least one of copper or a copper alloy, and
a second metallization layer comprising at least one of copper or a copper alloy, and wherein the first and second metallization layers are connected via plated-through holes comprising at least one of copper or a copper alloy.

7. The semiconductor component according to claim 6, wherein a thickness of the first metallization layer is greater than a thickness of the second metallization layer.

8. The semiconductor component according to claim 6, further comprising a plurality of metallization layers, wherein at least one metallization layer comprises a plurality of islands, wherein at least one of the plurality of islands has lower connection regions on an underside facing the semiconductor substrate and upper connection regions on a top side remote from the semiconductor substrate.

9. The semiconductor component according to claim 6, further comprising a plurality of metallization layers, wherein a topmost metallization layer connected to at least one bonding electrode comprises a plurality of strips extending parallel to one another, and wherein an underlying metallization layer comprises a plurality of strips extending parallel to one another and substantially perpendicular to the strips of the topmost metallization layer.

10. The semiconductor component according to claim 6, comprising a plurality of metallization layers, wherein at least three of the plurality of metallization layers have a first thickness and comprise at least one of copper or a copper alloy, and wherein another of the plurality of metallization layers is arranged above the at least three of the plurality of metallization layers and has a second thickness greater than the first thickness and comprises at least one of copper or a copper alloy, and wherein the another of the plurality of metallization layers is connected to the at least one bonding electrode.

11. The semiconductor component according to claim 6, further comprising a plurality of elongate first main electrode zones and a plurality of elongate second main electrode zones arranged alternately and parallel to one another, wherein the plurality of elongate first main electrode zones are each respectively connected to one of a plurality of first lower islands and the plurality of elongate second main electrode zones are each respectively connected to one of plurality of second lower islands, and wherein a first collective island is transversely arranged over the first and second lower islands and is connected to the first lower islands, and wherein a second collective island is connected to the second lower islands, and wherein the pluralities of first and second lower islands and the first and second collective islands comprise sections of metallization layers, wherein longitudinal sections of the pluralities of first and second lower islands covered by and connected to the respective first and second collective islands are not more than about four times as wide as the pluralities of the first and second main electrode zones respectively connected to the first and second lower islands, and wherein longitudinal sections of the pluralities of first and second lower islands covered by and not connected to the respective first and second collective islands are at least about five times as wide as the pluralities of first and second main electrode zones respectively connected to the first and second lower islands.

12. The semiconductor component according to claim 11, wherein longitudinal sections of the pluralities of first and second lower islands which are covered by and not connected to the respective first and second collective islands are at least about eight times as wide as the pluralities of first and second main electrode zones respectively connected to the first and second lower islands.

13. The semiconductor component according to claim 12, wherein longitudinal sections of the pluralities of first and second lower islands covered by and connected to the respective first and second collective islands are not more than about twice as wide as the pluralities of first and second main electrode zones respectively connected to the first and second lower islands.

14. The semiconductor component according to claim 12, wherein longitudinal sections of the pluralities of first and second lower islands covered by and connected to the respective first and second collective islands comprise interruptions in a longitudinal direction, and wherein silicon oxide regions are arranged between the interruptions.

* * * * *